United States Patent
Tokailin et al.

(10) Patent No.: US 7,270,586 B2
(45) Date of Patent: *Sep. 18, 2007

(54) ORGANIC ELECTROLUMINESCENCE ELEMENT AND PRODUCTION METHOD THEREOF

(75) Inventors: Hiroshi Tokailin, Sodegaura (JP); Yoshikazu Nagasaki, Sodegaura (JP); Tadao Shibuya, Sodegaura (JP); Kazuyoshi Inoue, Sodegaura (JP)

(73) Assignee: Idemitsu Kosan Co., Ltd., Tokyo (JP)

(*) Notice: Subject to any disclaimer, the term of this patent is extended or adjusted under 35 U.S.C. 154(b) by 316 days.

This patent is subject to a terminal disclaimer.

(21) Appl. No.: 10/972,509

(22) Filed: Oct. 26, 2004

(65) Prior Publication Data

US 2005/0085152 A1    Apr. 21, 2005

Related U.S. Application Data

(63) Continuation of application No. 10/460,678, filed on Jun. 13, 2003, now Pat. No. 6,828,045.

(51) Int. Cl.
*C23C 14/00* (2006.01)
*H01J 1/62* (2006.01)
*H01J 9/00* (2006.01)

(52) U.S. Cl. .................. 445/24; 445/25; 313/504; 428/690; 428/917; 204/192.1

(58) Field of Classification Search ............. 445/24–25
See application file for complete search history.

(56) References Cited

U.S. PATENT DOCUMENTS 5,981,092 A * 11/1999 Arai et al. ................. 313/504
6,312,837 B1 * 11/2001 Kijima ....................... 428/690
6,712,661 B1 * 3/2004 Kiguchi et al. .............. 445/24
6,963,383 B2 * 11/2005 Tokailin et al. ............ 428/690

FOREIGN PATENT DOCUMENTS

| JP | 03-105898 | 5/1991 |
|----|-----------|--------|
| JP | 09-063771 | 3/1997 |
| JP | 09-204985 | 8/1997 |
| JP | 09-260062 | 10/1997 |
| JP | 09-324176 | 12/1997 |
| JP | 10-214683 | 8/1998 |
| JP | 11-126689 | 5/1999 |
| JP | 2002-170666 | 5/2002 |

OTHER PUBLICATIONS

JPO Patent Abstract and JPO Machine Translation of JP 09-063771, published Mar. 7, 1997.

* cited by examiner

*Primary Examiner*—Sikha Roy
*Assistant Examiner*—Natalie K. Walford
(74) *Attorney, Agent, or Firm*—Steptoe & Johnson LLP

(57) ABSTRACT

An organic EL element comprising; an anode, a cathode, and an organic layer sandwiched therebetween containing at least an emitting layer, wherein a ratio, $[In3d_{5/2}]_h / [In3d_{5/2}]_n$, is from 0.9 to 1.2 wherein $[In3d_{5/2}]_h$ is the half band width of a spectral peak derived from a $3d_{5/2}$ orbit of an In atom in the surface of the anode, and $[In3d_{5/2}]_n$ is the half band width of a spectral peak derived from a $3d_{5/2}$ orbit of an In atom in the interior of the anode, the spectral peaks being measured by X-ray photoelectron spectroscopy (XPS): and the method for the production thereof.

4 Claims, 13 Drawing Sheets

ORGANIC ELECTROLUMINESCENCE ELEMENT AND PRODUCTION METHOD THEREOF

BACKGROUND OF THE INVENTION

1. Field of the Invention

The invention relates to an organic electro-luminescence element (organic EL element) and a producing method thereof, particularly an organic EL element that has a small increase in voltage at the constant-current driving time and a long life and a producing method thereof.

2. Description of the Background

In an organic EL element, an organic emitting layer is held between an anode and a cathode. The anode is a transparent electrode and formed of ITO and the like. The cathode is the opposite electrode and formed of Al and the like. Electrons and holes are injected into the organic emitting layer from the electrodes, respectively, and the electrons combine with the holes therein to excite organic emitting molecules. The exciting molecules return to the base state from the exiting state while discharging energy, which energy is taken out as light.

In such an organic EL element, the insufficient adhesion of the anode to the organic emitting layer laminated thereon causes dark spots, thereby reducing its luminous efficiency. For example, when an organic EL element is driven by a constant current, its driving voltage significantly increases with the passage of time and then its life becomes shorter. Further when an organic EL element is driven at high temperatures, its emission becomes ununiform and the luminous efficiency is further reduced.

Thus in order to improve the adhesion between an anode and an organic layer, it is suggested to interpose a buffer layer made of organic or inorganic compounds between the anode and organic layer.

For example, Japanese Patent Kokai No. 10-214683 shows an organic EL element with a 1 to 500 μm thick amorphous film made of a metal such as Au or Pt, metallic oxide such as MoOx, VOx, SnOx, InOx or BaOx, or a conjugate polymer to improve defective contact between an anode and organic layer.

Japanese Patent Kokai No. 3-105898 shows an organic EL element in which a hole transporting layer and electron transporting layer, which have been generally made of organic compounds, are made of an amorphous semiconductor (p or n type) with a thickness of about 500 Å to improve the emission properties. The amorphous semiconductor can be an excellent film.

Japanese Patent Kokai No. 9-63771 shows an organic EL element in which a 5 to 30 μm thick energy barrier layer is formed of a metallic oxide with a larger work function than ITO such as RuO, MoO or VO between an ITO anode and hole transporting layer.

However, the surface state of an anode layer has not been considered in the above organic EL elements and the adhesion between anode layer and organic layer has not been sufficiently improved. Therefore when the organic EL elements are driven by a constant current, the driving voltage increases and dark spots occurs. Further the organic EL elements cannot be made thin and the production time becomes longer, since the buffer layer has a thickness as thick as at least 1 μm.

Japanese Patent Kokai Nos. 9-3-24176 and 9-204985 show organic EL elements in which a hole injecting transporting material subjected to a terminal-processing by a silane coupling agent is used or an anode is subjected to a surface processing by a titanate coupling agent to improve the adhesion between the anode and organic layer.

However, in any one of the organic EL elements, the adhesion between the anode and organic layer has not been sufficiently improved and the emission properties rather disperse.

Japanese Patent Kokai No. 9-260062 shows an organic EL element in which a mixed layer with a resistance of 20 Ω·cm or less is formed of a mixture of ITO and inorganic semiconductor instead of a hole injection transporting material in a thickness of about 50 to 1000 Å to avoid direct contact of an ITO anode with an organic layer.

However, the surface state of an anode layer has not been considered in the above organic EL element and the anode layer does not sufficiently adhere to the mixed layer.

Japanese Patent Kokai No. 11-126689 shows a method for producing an organic EL element in which a substrate is subjected to inverse sputtering by RF sputtering before the formation of a transparent electrode film so that the maximum surface roughness of the substrate is smaller than 15 nm and the average roughness is smaller than 10 nm.

Further the document teaches that the preferred distance between the substrate and target is form 4 to 15 cm in this method, since an ordinary RF sputtering device is used.

However, the method of Japanese Patent Kokai No. 11-126689 does not examine the composition of surface of anode layer, although it is directed to the roughness in the surface of substrate. Thus, the adhesion between the anode and organic layer is not sufficiently improved.

In addition, the distance between the substrate and target is narrow, since an ordinary RF sputtering device is used. As a result, it is difficult to change the conditions of inverse sputtering.

Therefore the organic EL element produced by the method of Japanese Patent Kokai No. 11-126689 is difficult to suppress increase when driven by a constant current and cannot satisfy the practical performances in information display devices and display devices mounted in vehicles.

It has been found that the increase in driving voltage is caused by surface defects in the anode surface which reduces the electron injecting properties. The surface defects is a thin layer with a thickness of about 10 Å existing in the surface part of anode layer and has a different composition from the interior (bulk) of anode layer. The surface defects are inevitably formed during the producing steps of organic EL elements. Their formation seems to be caused by etching residuals in the steps of patterning and cleaning the surface of anode layer, water absorption to the surface of anode layer, the deposition of impurities such as Sn atoms which are contained in minute amounts in the bulk of anode layer, or the like.

The inventors have made efforts to attain the above object and found that the adhesion with an organic layer can be effectively improved by reducing surface defects by improving an anode layer itself, specifically associating the surface composition of anode with the interior composition, thereby making the present invention.

An object of the invention is to provide an organic EL element with a long life in which voltage increase is small at the constant-current driving time.

Another object of the invention is to provide a method for efficiently producing such an organic EL element with a long life.

SUMMARY OF THE INVENTION

According to the present invention, there is provided an organic EL element comprising; an anode, a cathode, and an organic layer sandwiched therebetween containing at least an emitting layer, wherein a ratio, $[In3d_{5/2}]_h/[In3d_{5/2}]_n$, is from 0.9 to 1.2 wherein $[In3d_{5/2}]_h$ is the half band width (FMHM, full Width at Half Maximum) of a spectral peak derived from a $3d_{5/2}$ orbit of an In atom ($In3d_{5/2}$ spectral peak) in the surface of the anode, and $[In3d_{5/2}]_n$ is the half band width of a spectral peak derived from a $3d_{5/2}$ orbit of an In atom in the interior of the anode, the spectral peaks being measured by X-ray photoelectron spectroscopy (XPS), and this organic EL element can solve the problem described above.

By limiting the ratio of half band widths $[In3d_{5/2}]$ of $In3d_{5/2}$ spectral peaks in the surface and the interior of anode, the existence rate of surface defects can be decreased. Thus, the organic EL element with lower increase in voltage at the constant-current driving time and a long life can be provided.

In the organic EL element of the present invention, an area ratio $S_B/S_A$ preferably satisfies the following formula:

$$S_B/S_A<0.3$$

wherein $S_A$ is the area of a peak A that is a spectral peak derived from an oxygen is orbit (a spectral peak of oxygen is) with a binding energy of 530±0.5 eV in the surface of the anode and $S_B$ is the area of a peak B that is a spectral peak derived from an oxygen is orbit with a binding energy of 532±1.0 eV in the surface of the anode, the spectral peaks being measured by XPS.

By remarking the oxygen is spectral peaks of the surface and the interior of anode, the existence rate of surface defects can be presumed correctly. Thus, the organic EL element with lower increase in voltage at the constant-current driving time and a long life can be provided.

In the organic EL element of the present invention, the inorganic compound forming the surface protection film is preferably an oxide containing a Ce atom.

According to this element, a relatively dense surface protection film can be formed. For example, even if the thickness of film is 50 Å or less, the voltage increase at the constant-current driving time can be effectively suppressed and the surface protection film with a certain heat resistance can be obtained.

In the organic EL element of the present invention, the thickness of the surface protection film is preferably from 5 Å to 100 Å.

According to this element, increase in driving voltage of organic EL element caused by the electric insulation properties of surface protection film can be prevented. In addition, the voltage increase at the constant-current driving time can be suppressed and the surface protection film with a certain heat resistance can be obtained.

In the organic EL element of the present invention, the inverse sputtering is preferably carried out by inductively coupled RF plasma sputtering magnetron sputtering (ICMS).

According to this element, the surface defects in anode surface can be reduced effectively, and the compositions of the interior and surface of anode can be substantially the same.

In the organic EL element of the present invention, the surface of the anode is preferably subjected to inverse sputtering.

According to this element, the surface defects in anode surface can be decreased effectively.

In the organic EL element of the present invention, the anode preferably comprises indium tin oxide (ITO) or indium zinc oxide (IZO).

By using such materials which have been widely used as a transparent electrode, the cost can be lowered and excellent heat resistance can be obtained. In addition, the emitting of the organic EL element can be taken to the outside effectively.

In the organic EL element of the present invention, the anode preferably comprises an amorphous transparent conductive oxide.

According to this organic EL element, the organic EL element having excellent etching properties can be provided.

In the organic EL element of the present invention, a voltage increase is preferably 1 V or less when the element is continuously driven by constant direct current until its half time.

By limiting the voltage increase until its half time, the organic EL element can be provided suitable for portable information display devices and display devices mounted in vehicles.

The another embodiment of present invention is a method for producing an organic EL element comprising an anode, a cathode and an organic layer therebetween containing at least an emitting layer, characterized by comprising the steps of:

forming an anode on a substrate, forming an inorganic compound layer to the surface of the anode, forming an organic layer containing an emitting layer, and forming an cathode.

According to this method, the existence rate of surface defects in the surface of anode layer can be reduced. As a result, the organic EL element with lower increase in voltage at the constant-current driving time and a long life can be effectively provided.

In the method of the present invention, the surface protection film comprising an inorganic compound is preferably formed after or at the same time when the surface of the anode is subjected to inverse sputtering in the step of forming the inorganic compound to the surface of the anode.

The inverse sputtering defines the surface processing which gives an impact to the surface of anode layer of substrate using a sputter gas as ions generated by plasma. This inverse sputtering can be carried out by using a sputtering device and irradiating the sputter gas to the substrate formed the anode layer instead of a target.

According to this method, the regeneration of surface defects in the surface of anode layer can be effectively prevented.

In the method of the present invention, the inverse sputtering is preferably carried out by inductively coupled RF plasma sputtering magnetron sputtering (ICMS).

According to this method, the existence rate of surface defects in the surface of anode layer can be effectively reduced. A plasma cleaning mechanism can give substantially the same effect as the inverse sputtering.

In the method of the present invention, the inverse sputtering is preferably carried out by applying power of 50 to 200 W and high-frequency waves of 13.56 to 100 MHz to a helical coil, applying power of 200 to 500 W and high-frequency waves of 13.56 to 100 MHz to a cathode for plasma discharge and making the strength of a magnetic field ranging from 200 to 300 gauss.

According to this method, the existence rate of surface defects in the surface of anode layer can be effectively reduced.

BEST MODE FOR CARRYING OUT THE INVENTION

FIRST EMBODIMENT

A first embodiment provides an organic EL element having an anode and a cathode wherein the ratio of the half band width $[In3d_{5/2}]_h$ of an $In3d_{5/2}$ spectral peak measured by X-ray photoelectron spectroscopy (XPS) in the surface of anode to the half band width $[In3d_{5/2}]_n$ of an $In3d_{5/2}$ spectral peak measured by XPS in the interior of the anode layer ($[In3d_{5/2}]_h/[In3d_{5/2}]_n$) is from 0.9 to 1.2.

The organic EL element of the first embodiment will be explained with reference to FIGS. 1, 2 and the like, assuming that the anode is a transparent electrode.

(1) Substrate

Figure 2:
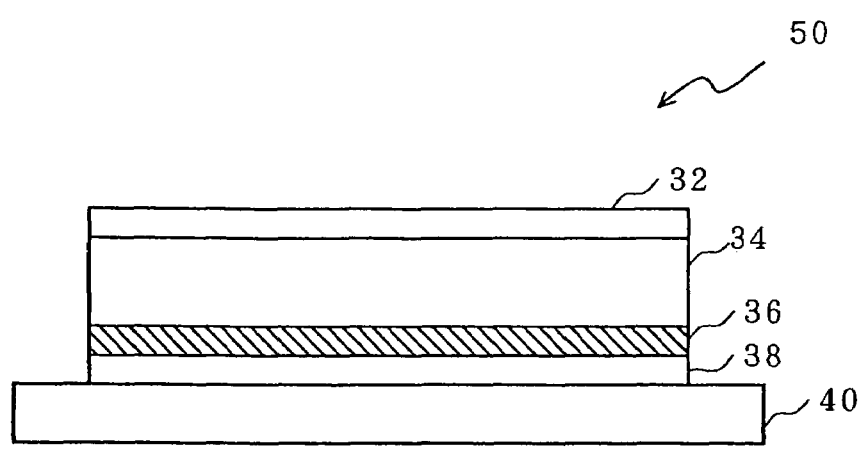
FIG. 2 is a sectional view of the organic EL element according to the first embodiment.

In an organic EL element 50 shown in FIG. 2, a substrate 40 is preferably made of a transparent rigid material. Such substrate allows to improve the mechanical strength such as impact resistance and effectively take EL light to the outside.

Materials for the substrate include glass plates, ceramic plates and plastic plates (polycarbonate, acrylic, vinyl chloride, polyethylene terephthalate, polylmide, polyester resins and the like).

(2) Anode 1

In the organic EL element 50 shown in FIG. 2, an anode 38 is preferably made of a material having a large work function, e.g. 4 eV or more. Preferred materials include ITO and IZO. The other amorphous transparent conductive oxides, laminates of metals with a high conductivity such as Ag and thin films, or the metals sandwiched by thin films may be preferably used.

In the case of taking light from the anode to the outside, the transmissivity of anode is preferably 10% or higher, more preferably 50% or higher.

The sheet resistance of anode is preferably 1,000 Ω/□ or less, more preferably 500 Ω/□ or less since such resistance can reduce driving voltage.

In general the thickness of anode is preferably from 10 nm to 1 μm, more preferably from 10 nm to 200 nm although it depends on its material.

The anode can be easily formed by depositing or sputtering a material.

(3) Anode 2

The anode 38 of the element 50 in FIG. 2 is made of ITO, IZO and the like. If the anode 38 has surface defects, the following phenomena are generally observed.

(a) The concentration of Sn relatively decreases or that of Zn relatively increases due to the deposition of Sn or deficiency of Zn on the surface of anode layer.

(b) Oxygen holes decrease in the surface of anode layer and the amount of oxygen atoms in the surface is larger than that in the interior thereof.

(c) Impurities such as water are attached to the surface.

(d) Minute amounts of impurities contained in a bulk are deposited onto the surface of anode layer. For example, there exist nitrogen, fluorine and metal ions such as Na.

Thus, if surface defects exist, the valence of In atoms change dependently on the properties of defects, resulting in changes in energy state of inner-shell electrons of In. By using this phenomenon, if a half band width of a spectral peak is measured by XPS, surface defects can be detected.

Figure 13:
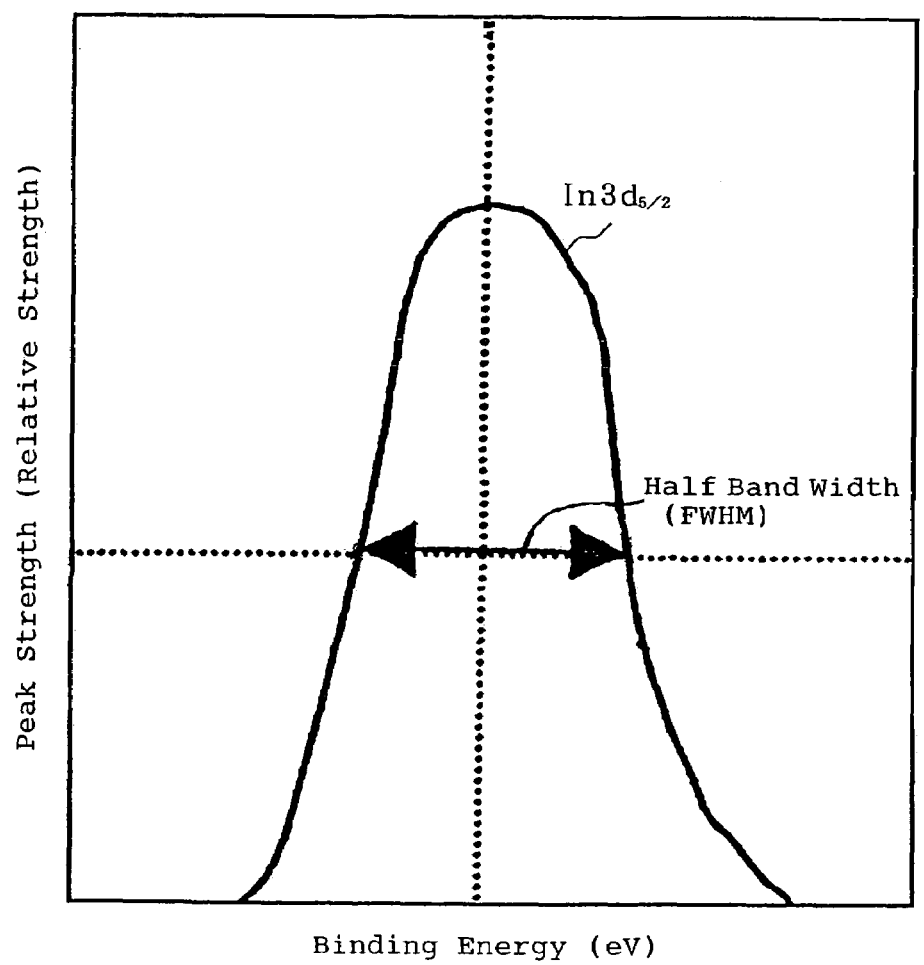
FIG. 13 is a view showing a half band width of an $In3d_{5/2}$ spectral peak.

Specifically, as shown in FIG. 13, $In3d_{5/2}$ spectral peaks in the surface and interior of an anode layer are measured and then calculate the half band width $[In3d_{5/2}]_h$ of $In3d_{5/2}$ spectral peak in the surface and the half band width $[In3d_{5/2}]_n$ of $In3d_{5/2}$ spectral peak in the interior. Here FIG. 13 shows a spectral peak with the abscissa of binding energy (eV) and the ordinate of peak strength.

Next the ratio of these half band widths, $[In3d_{5/2}]_h/[In3d_{5/2}]_n$, is calculated. The problem of surface defects can be avoided by adjusting the ratio within the range of 0.9 to 1.2.

If the ratio of half band widths is less than 0.9, it means that the composition of the surface is different from that of the interior in an anode layer and voltage at the constant-current driving time may be larger. If the ratio of half band widths exceeds 1.2, surface defects increase and voltage at the constant-current driving time may be larger.

For these reasons, the ratio of half band widths is preferably from 0.95 to 1.15, more preferably 1 to 1.1.

The ratio of half band widths can be controlled by adjusting the flow amount of sputtering gas or changing a distance from a substrate, sputtering time, kind of sputtering gas, sputtering gas pressure, evacuated pressure and the like, as described later.

Figure 3:
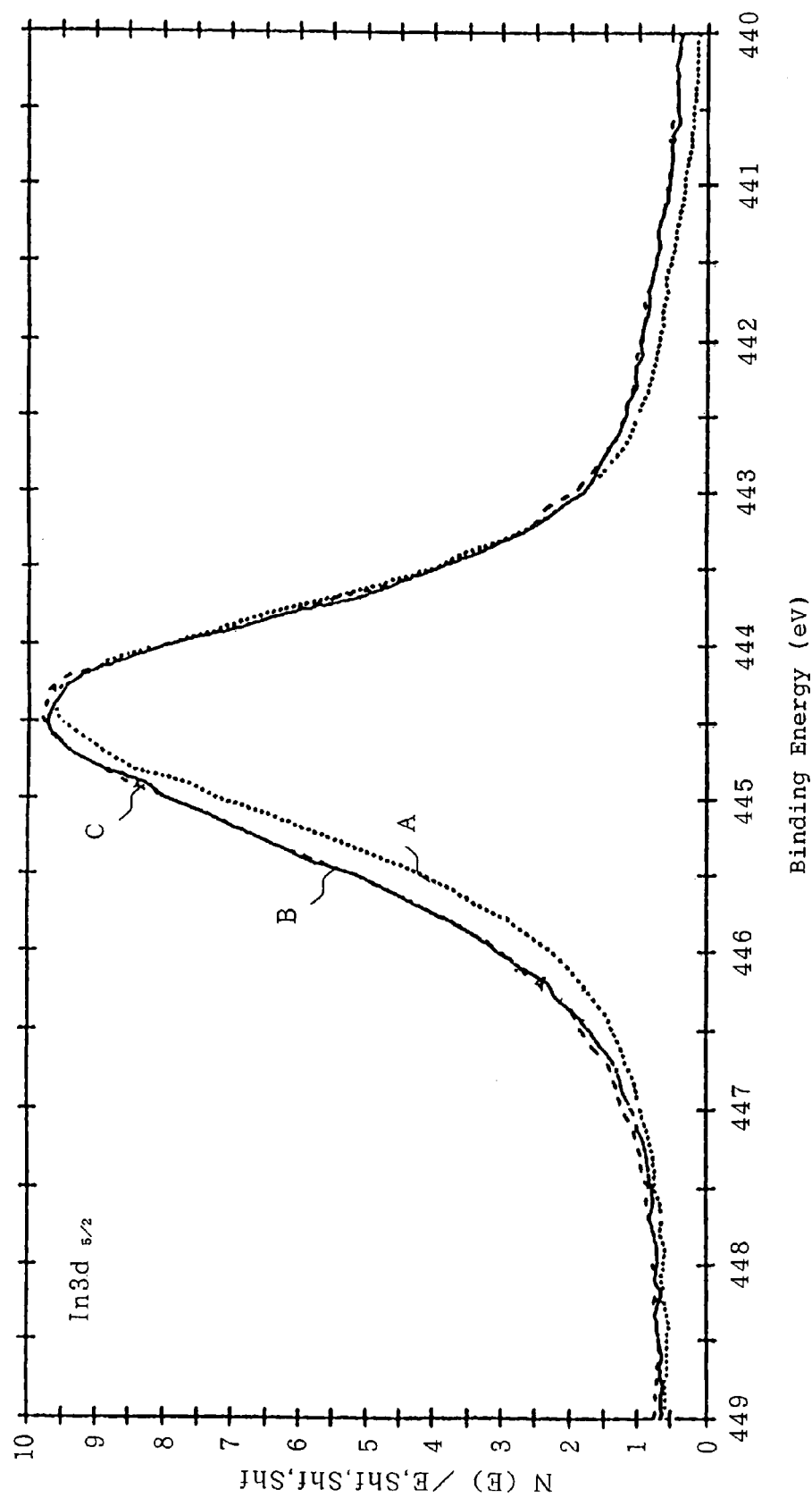
FIG. 3 is a view showing $In3d_{5/2}$ spectral peaks by XPS in an ITO surface subjected to varied processing such as inverse sputtering.

In FIG. 3, "A" represents a chart derived from the $3d_{5/2}$ orbit of In ($In3d_{5/2}$ chart) by XPS in an ITO surface that has been subjected to inverse sputtering for 1 minute by $Ar^+$ of RF sputtering. For comparison, "B" represents an $In3d_{5/2}$ chart by XPS in the ITO surface before the inverse sputtering, and "C" represents an $In3d_{5/2}$ chart by XPS in the ITO surface that has been subjected to inverse sputtering and then exposed to the atmosphere for 5 hours.

Figure 5:
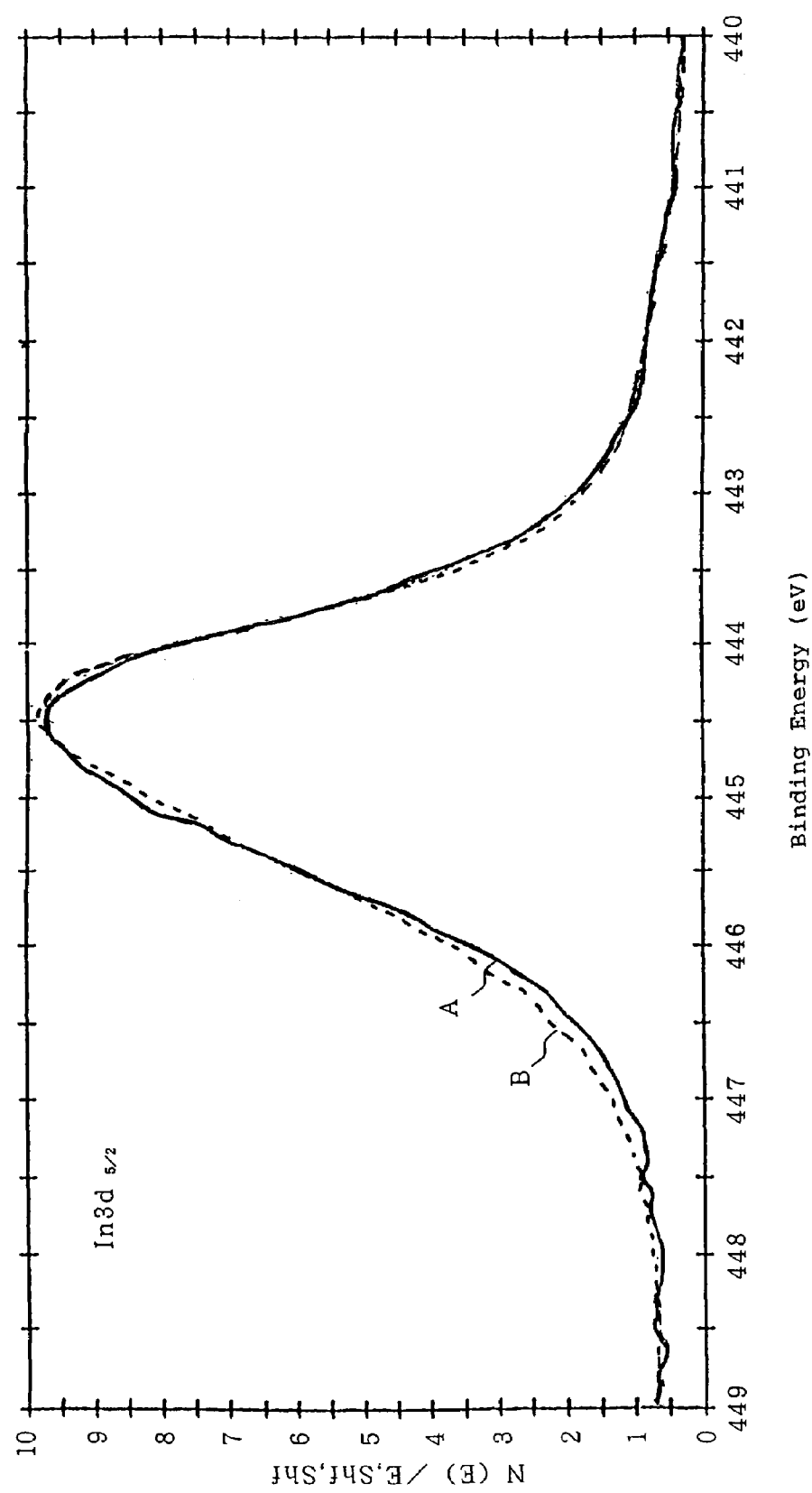
FIG. 5 is a view showing $In3d_{5/2}$ spectral peaks by XPS in an ITO surface with a $CeO_2$ film (surface protection film) subjected to varied processing such as inverse sputtering.

In FIG. 5, "A" represents an $In3d_{5/2}$ spectral peak measured by XPS in an ITO surface which has been subjected to inverse sputtering for 1 minute by $Ar^+$ of RF sputtering and thereafter coated with a $CeO_2$ film (surface protection film) with a 20 Å thickness.

Thus, the $In3d_{5/2}$ spectral peak A shows that surface defects do not increase since the ITO surface is covered with the $CeO_2$ film and not contacted directly with the atmosphere.

Even if the ITO surface has the $CeO_2$ film (surface protection film) with a 20 Å thickness thereon, an $In3d_{5/2}$ spectral peak of the ITO surface can be measured without removing the $CeO_2$ film from the point of view of XPS principle.

In FIG. 5, "B" represents an $In3d_{5/2}$ spectral peak in the state where the ITO with the $CeO_2$ film (surface protection film) explained on the chart A is etched by $Ar^+$ for detecting XPS depth profiles to make the interior of ITO exposed, that is, at the depth of 50 Å.

These $In3d_{5/2}$ spectral peaks show that the inverse sputtering of ITO surface improves the anode layer. Specifically it makes the state of the anode surface. (A) similar to that of the anode interior (B), thereby reducing surface defects. The form of peak A does not significantly change even if the surface is exposed to the atmosphere at ordinary temperature and humidity for 5 hours. This means that the surface protection film can effectively prevent the occurrence of surface defect again after inverse sputtering for a certain period of time.

Figure 9:
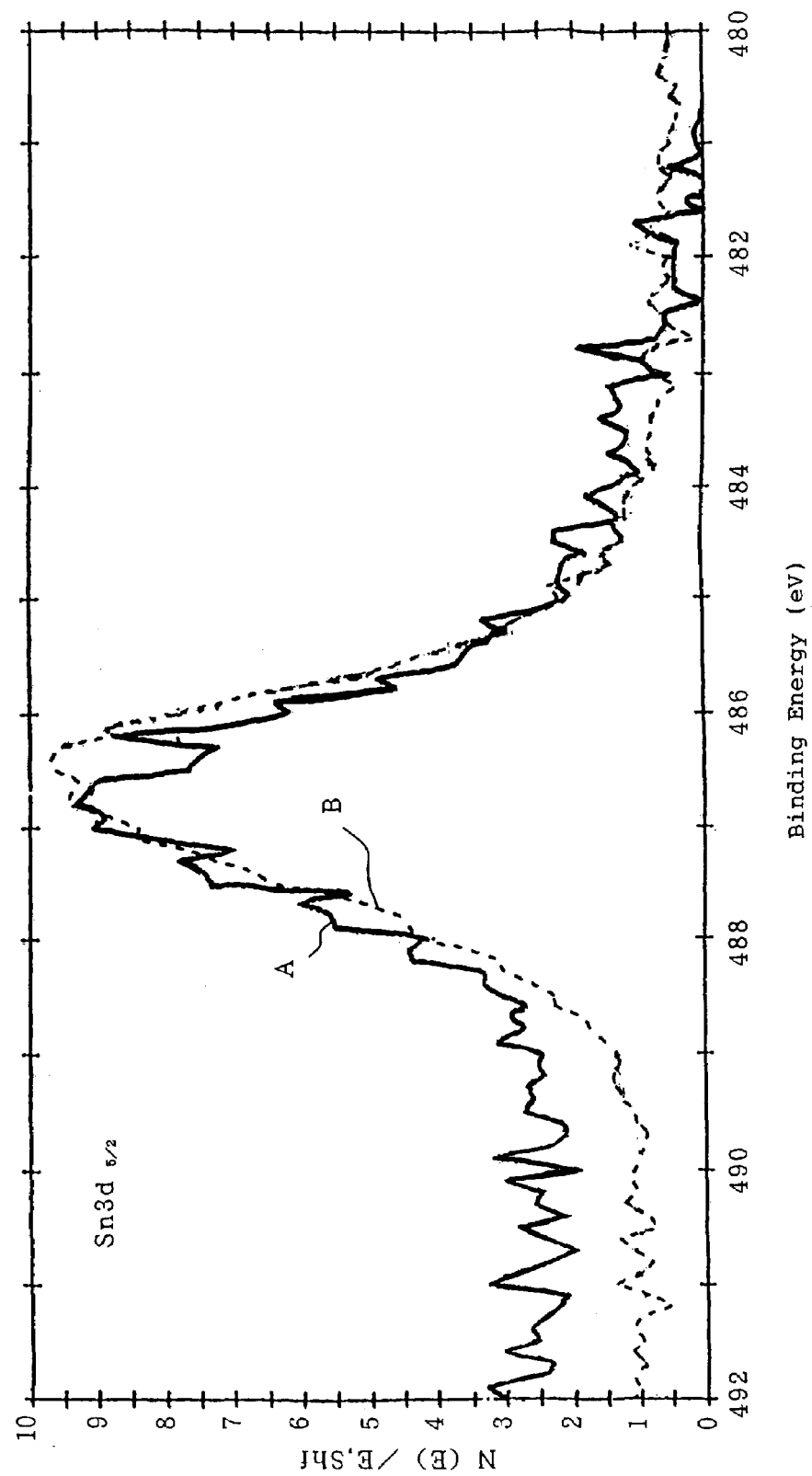
FIG. 9 is a view showing $Sn3d_{5/2}$ spectral peaks by XPS in an ITO surface subjected to varied processing such as inverse sputtering.

In FIG. 9, "A" represents a $3d_{5/2}$ spectral peak of Sn atoms ($Sn3d_{5/2}$ spectral peak) measured by XPS in an ITO surface which has been subjected to inverse sputtering for 1 minute by $Ar^+$ of RF sputtering and thereafter coated with a $CeO_2$ film (surface protection film) with a 20 Å thickness.

In FIG. 9, "B" represents a $Sn3d_{5/2}$ spectral peak in the state where the ITO with the $CeO_2$ film (surface protection film) explained on the chart A is etched by $Ar^+$ for detecting XPS depth profiles to make the interior of ITO exposed, that is, at the depth of 50 Å.

FIG. 9 shows that the inverse sputtering can effectively remove a defective surface layer from the ITO surface, i.e., a part where the composition ratio of Sn atoms has changed.

(4) Anode 3

In the case where a surface protection layer does not comprise an oxide or composite oxide, the presence of surface defects in an anode can be presumed by an oxygen 1s spectral peak measured by XPS. The area ratio $S_B/S_A$ preferably satisfy the following formula:

$$S_B/S_A < 0.3$$

wherein $S_A$ is the area of a peak A that is an oxygen 1s spectral peak at the binding energy of 530±0.5 eV, and $S_B$ is the area of a peak B that is an oxygen 1s spectral peak at the binding energy of 532±1.0 eV.

The area ratio $S_B/S_A$ of 3.0 or larger may mean the ratio of attached oxygen derived from impurities to oxygen derived from In oxides increases over an allowable range.

Thus the area ratio $S_B/S_A$ is preferably 0.2 or less, more preferably 0.1 or less.

The area ratio can be controlled by adjusting the flow amount of sputtering gas or changing a distance from a substrate, sputtering time, kind of sputtering gas, sputtering gas pressure, evacuated pressure and the like, as described later.

Figure 4:
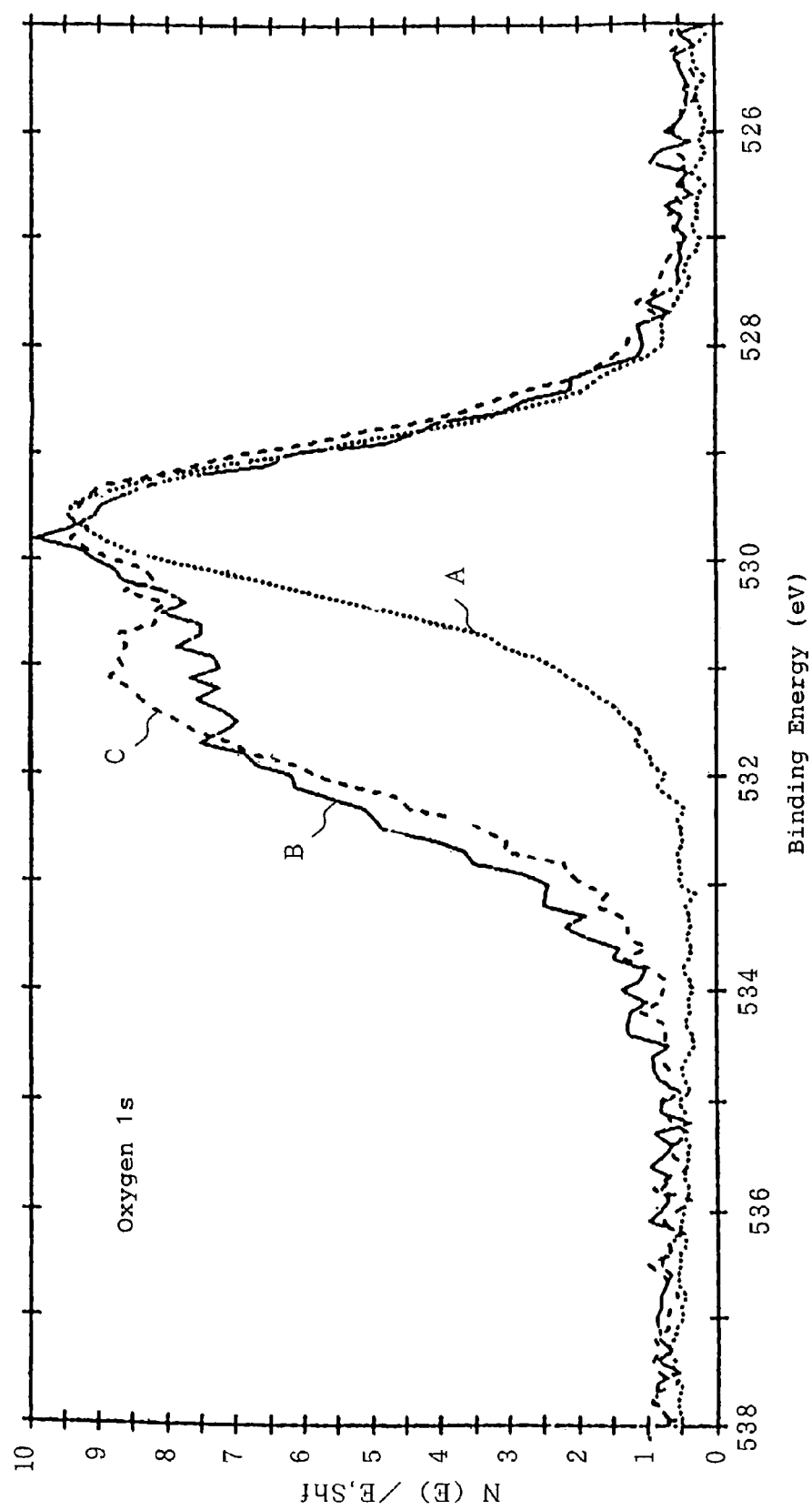
FIG. 4 is a view showing oxygen is spectral peaks by XPS in an ITO surface subjected to varied processing such as inverse sputtering.

In FIG. 4, "A" represents a spectral peak chart derived from the 1s orbit of oxygen (oxygen 1s chart) by XPS in an ITO surface that has been subjected to inverse sputtering for 1 minute by $Ar^+$ of RF sputtering. For comparison, "B" represents an oxygen 1s chart by XPS in the ITO surface before the inverse sputtering, and "C" represents an oxygen 1s chart by XPS in the ITO surface that has been subjected to inverse sputtering and then exposed to the atmosphere for 5 hours.

Figure 6:
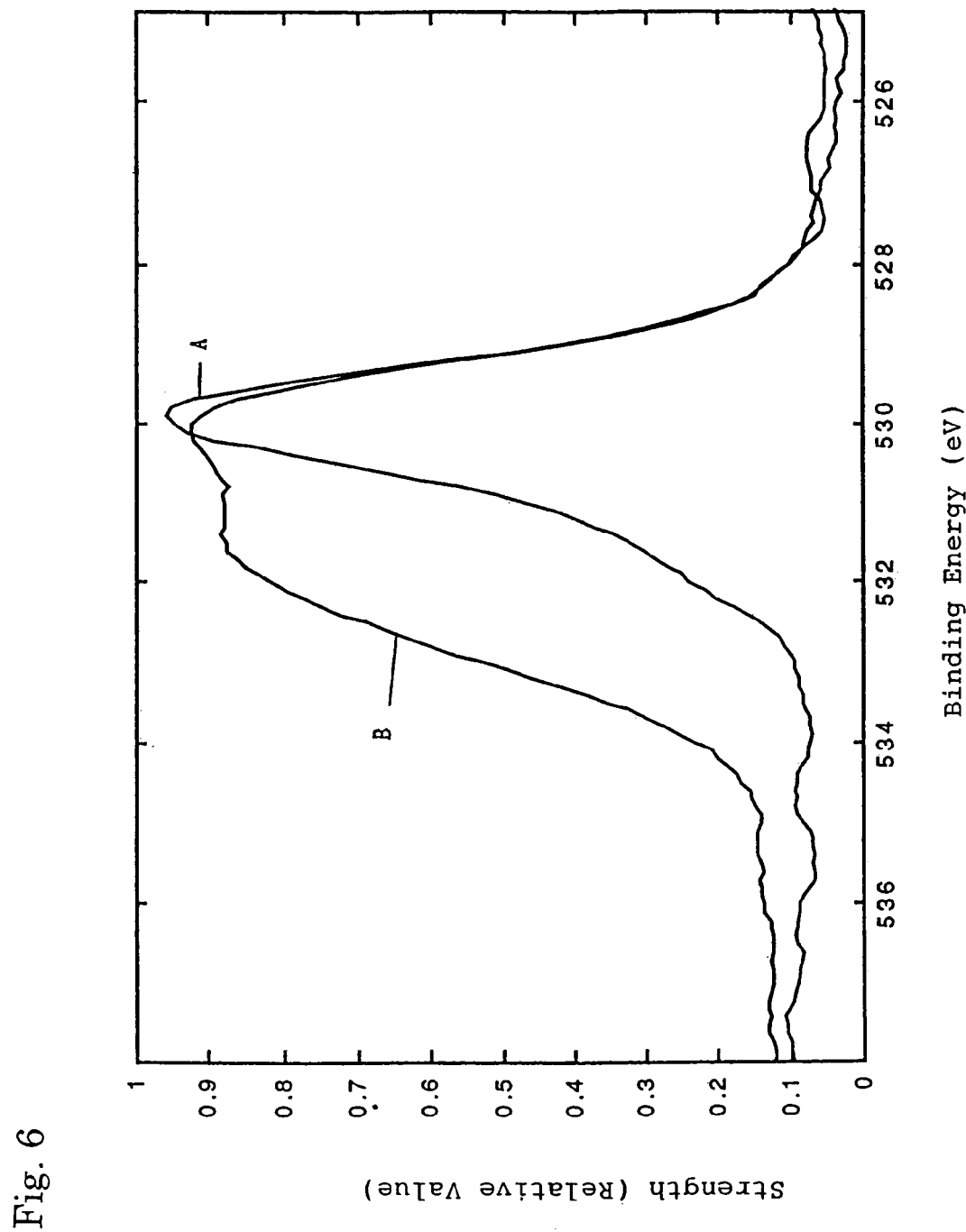
FIG. 6 is a view showing oxygen is spectral peaks by XPS in an ITO surface attached with carbon subjected to varied processing such as inverse sputtering.

In FIG. 6, "A" represents an oxygen 1s chart by XPS in an ITO surface with a carbon film of a 20 Å thickness and "B" represents an oxygen 1s chart by XPS in the ITO surface with the carbon film that has been exposed to the atmosphere for 24 hours. The oxygen 1s chart of ITO surface exposed to the atmosphere for 24 hours remarkably changes compared with the chart A.

Figure 7:
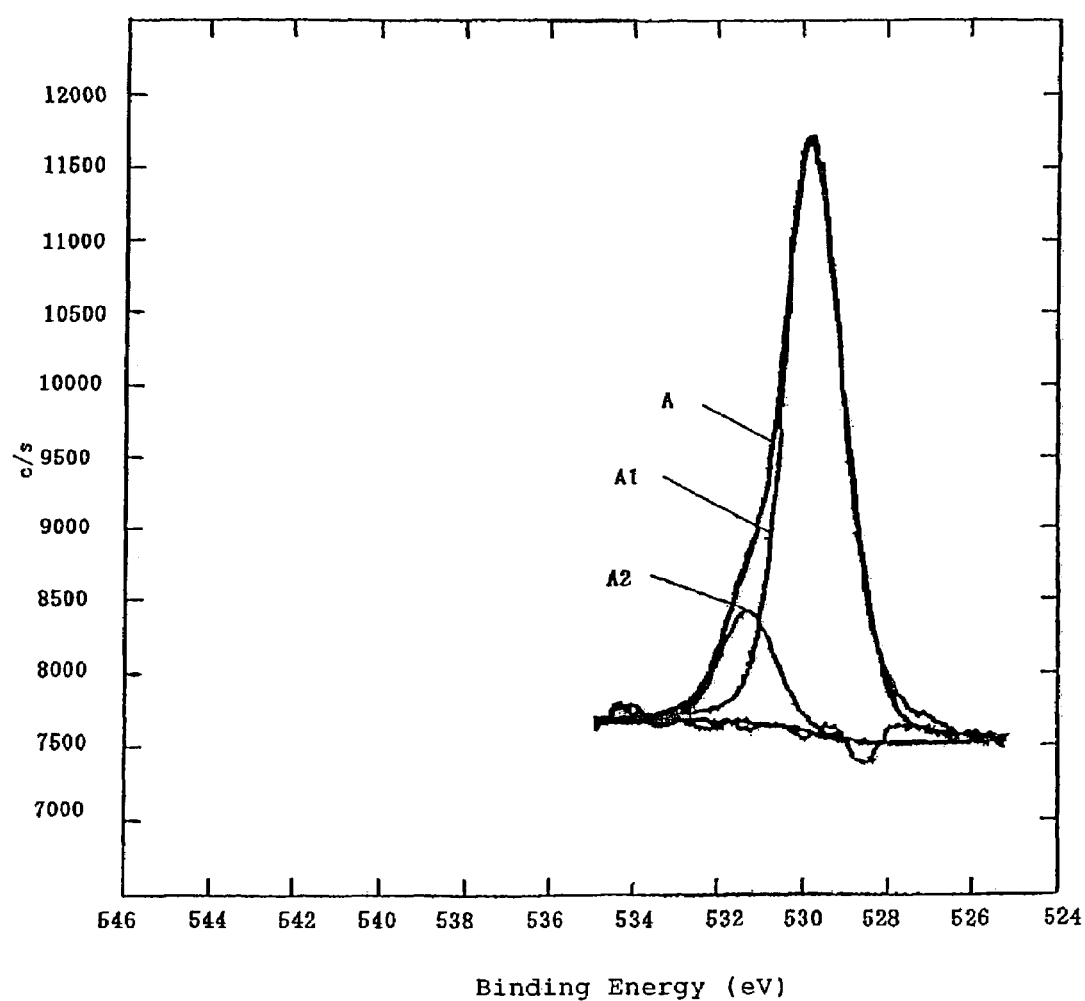
FIG. 7 is a view showing charts obtained by waveform separation of the chart A of oxygen is spectral peak shown in FIG. 6.

FIG. 7 shows charts A1 and A2 obtained by the waveform separation of the chart A shown in FIG. 6.

Figure 8:
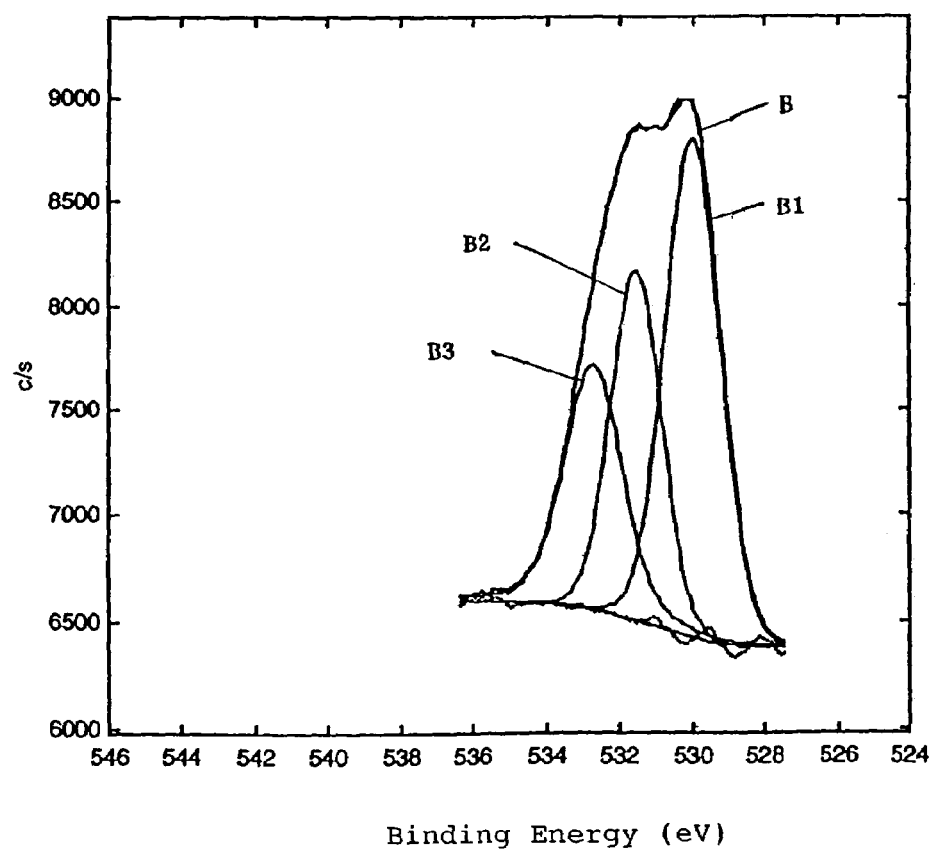
FIG. 8 is a view showing charts obtained by waveform separation of the chart B of oxygen is spectral peak shown in FIG. 6.

FIG. 8 shows charts B1, B2 and B3 obtained by the waveform separation of the chart B shown in FIG. 6.

These charts of waveform separation show that if ITO with carbon is left for a long period of time at atmospheric pressure, the composition of ITO surface changes to produce a defective surface layer. Further an oxygen 1s chart does not substantially change compared with the chart A until ITO is exposed to the atmosphere for 10 hours. This shows that the state of removing a defective surface layer is maintained for a certain period of time, 5 to 10 hours after a carbon film has been formed.

In order to presume the presence of surface defects in an anode, the ratio of atomic concentration $[Sn/In]_h$ in the surface of anode and the ratio of atomic concentration $[Sn/In]_n$ in the interior thereof may be measured to obtain the ratio $[Sn/In]_h/[Sn/In]_n$, instead of measuring half band widths of $In3d_{5/2}$ spectral peaks or oxygen 1s spectral peaks by XPS.

However, it has been found that even by using XPS, the concentrations of Sn and In disperse and therefore the atomic concentration ratio [Sn/In] cannot be exactly measured in the surface and interior of anode.

(5) Cathode

In the organic EL element 50 shown in FIG. 2, a cathode 32 is preferably made of a material having a low work function, e.g., less than 4 eV, for example, metals, alloys and electric conductive compounds.

Such Materials for the cathode include sodium, sodium-potassium alloys, magnesium, lithium, magnesium-silver alloys, aluminum/alumina ($Al_2O_3$), aluminum-lithium alloys, indium and rare earth metals.

The sheet resistance of cathode is preferably 1,000 Ω/□ or less, more preferably 500 Ω/□ or less.

The Thickness of cathode is preferably from 10 nm to 1 μm, more preferably from 50 nm to 200 nm.

The cathode can be formed as a thin film by depositing or sputtering a material.

(6) Organic Layer

In the organic EL element 50 shown in FIG. 2, a layer having a recombination region or light-emitting region is used as an organic layer 34.

The recombination region or light-emitting region generally exists in an emitting layer. Thus only an emitting layer may be used as the organic layer. However, in addition to the emitting layer, there may be preferably formed a hole injecting layer, electron injecting layer, organic semiconductive layer, electron barrier layer, adhesion improving layer and the like, if necessary.

(a) Emitting Layer

A preferred emitting layer in the invention may use distyryl arylene compounds as a light-emitting material (host).

The emitting layer can be formed by the dissolution in a solvent with a binding material such as resins and the formation of a thin film using the solution by a spin-coating method and the like. The thickness of the emitting layer thus formed is not limited and properly selected. Preferred thickness is from 1 nm to 10 μm, more preferably from 5 nm to 5 μm.

(b) Electron Injecting Layer (Containing Adhesion Improving Layer)

An electron injecting layer is an organic layer for improving the injection of electrons to an emitting layer. It preferably has a large electron moving degree. An adhesion improving layer is a kind of electron injecting layers. It comprises a material having not only a large electron moving degree but also a good adhesive property to a cathode.

Thus, preferred materials for the electron injecting layer include 8-hydroxyquinoline, metal complexes such as 8-hydroxyquinoline derivatives and oxadiazole derivatives.

Preferred Materials for the Adhesion Improving Layer include 8-hydroxyquinoline and metal complexes such as 8-hydroxyquinoline derivatives.

(c) Hole Injecting Layer

A hole injecting layer is an organic layer for fascinating the injection of holes to an emitting layer. It is preferably made of a material having a large hole moving degree and an ionization energy as small as 5.5 eV or less generally.

Further it is preferably made of a material capable of transporting holes to an emitting layer in a lower electric field. For example the degree of transporting holes is preferably at least $1\times10^{-6}$ cm$^2$/v·second when an electric field of $1\times10^4$ to $1\times10^6$ V/cm is applied.

Materials for the hole injecting layer include porphylin compounds.

(7) Surface Protection Film

A surface protection film 36 is preferably formed on the surface of an anode 38 in an organic EL element 50 as shown in FIG. 2.

Such surface protection film can effectively prevent the occurrence of surface defects after the formation thereof. Further, the surface protection film can enhance not only the close contact between an anode and an organic layer but also the heat resistance of an organic EL element.

(a) Constituent Material

Materials for the surface protection film include inorganic compounds such as oxides, nitrides, oxynitrides, sulfides, carbides and fluorides which contain one or two or more atoms selected from Li, Na, K, Rb, Cs, Cu, Mg, Ba, Ca, Sr, Zn, Cd, Al, Ga, In, Sc, Y, Si, Ge, Ti, Zr, Hf, Sb, Nb, Ta, Se, Cr, W, Fe, Co, Yb, Eu, Ce, La, Rb, Lu, Ho, Er, Sm and Tm.

Carbon is also preferable for the surface protection film, although it is organic compounds.

Specifically, the inorganic compounds for the surface protection film include metallic oxides and metallic nitrides such as LiOx, LiNx, NaOx, KOx, RbOx, CsOx, BeOx, MgOx, MgNx, CaOx, CaNx, SrOx, BaOx, ScOx, YOx, YNx, LaOx, LaNx, CeOx, PrOx, NdOx, SmOx, EuOx, GdOx, TbOx, DyOx, HoOx, ErOx, TmOx, YbOx, LuOx, TiOx, TiNx, ZrOx, ZrNx, HfOx, HfNx, ThOx, VOx, VNx, NbOx, NbNx, TaOx, TaNx, CrOx, CrNx, MoOx, MoNx, WOx, WNx, MnOx, ReOx, FeOx, FeNx, RuOx, OsOx, CoOx, RhOx, IrOx, NiOx, PdOx, PtOx, CuOx, CuNx, AgOx, AuOx, ZnOx, CdOx, HgOx, BOx, BNx, AlOx, AlNx, GaOx, GaNx, InOx, SiNx, GeOx, SnOx, PbOx, POx, PNx, AsOx, SbOx, SeOx and TeOx wherein x is from ½ to 2.

The materials also include metallic composite oxides such as LiAlO$_2$, Li$_2$SiO$_3$, Li$_2$TiO$_3$, Na$_2$Al$_2$O$_3$, NaFeO$_2$, Na$_4$SiO$_4$, K$_2$SiO$_3$, K$_2$TiO$_3$, K$_2$WO$_4$, Rb$_2$CrO$_4$, Cs$_2$CrO$_4$, MgAl$_2$O$_4$, gFe$_2$O$_4$, MgTiO$_3$, CaTiO$_3$, CaWO$_4$, CaZrO$_3$, SrFe$_{12}$O$_{19}$, SrTiO$_3$, SrZrO$_3$, BaAl$_2$O$_4$, BaFe$_{12}$O$_{19}$, BaTiO$_3$, Y$_3$Al$_5$O$_{12}$, Y$_3$Fe$_5$O$_{12}$, LaFeO$_3$, La$_3$Fe$_5$O$_{12}$, La$_2$Ti$_2$O$_7$, CeSnO$_4$, CeTiO$_4$, Sm$_3$Fe$_5$O$_{12}$, EuFeO$_3$, Eu$_3$Fe$_5$O$_{12}$, GdFeO$_3$, Gd$_3$Fe$_5$O$_{12}$, DyFeO$_3$, Dy$_3$Fe$_5$O$_{12}$, HoFeO$_3$, Ho$_3$Fe$_2$O$_{12}$, ErFeO$_3$, Er$_3$Fe$_5$O$_{12}$, Tm$_3$Fe$_5$O$_{12}$, LuFeO$_3$, Lu$_3$Fe$_5$O$_{12}$, NiTiO$_3$, Al$_2$TiO$_3$, FeTiO$_3$, BaZrO$_3$, LiZrO$_3$, MgZrO$_3$, HfTiO$_4$, NH$_4$VO$_3$, AgVO$_3$, LiVO$_3$, BaNb$_2$O$_6$, NaNbO$_3$, SrNb$_2$O$_6$, KTaO$_3$, NaTaO$_3$, SrTa$_2$O$_6$, CuCr$_2$O$_4$, Ag$_2$CrO$_4$, BaCrO$_4$, K$_2$MoO$_4$, Na$_2$MoO$_4$, NiMoO$_4$, BaWO$_4$, Na$_2$WO$_4$, SrWO$_4$, MnCr$_2$O$_4$, MnFe$_2$O$_4$, MnTiO$_3$, MnWO$_4$, CoFe$_2$O$_4$, ZnFe$_2$O$_4$, FeWO$_4$, CoMoO$_4$, CoTiO$_3$, CoWO$_4$, NiFe$_2$O$_4$, NiWO$_4$, CuFe$_2$O$_4$, CuMoO$_4$, CuTiO$_3$, CuWO$_4$, Ag$_2$MoO$_4$, Ag$_2$WO$_4$, ZnAl$_2$O$_4$, ZnMoO$_4$, ZnWO$_4$, CdSnO$_3$, CdTiO$_3$, CdMoO$_4$, CdWO$_4$, NaAlO$_2$, MgAl$_2$O$_4$, SrAl$_2$O$_4$, Gd$_3$Ga$_5$O$_{12}$, InFeO$_3$, MgIn$_2$O$_4$, Al$_2$TiO$_5$, FeTiO$_3$, MgTiO$_3$, Na$_2$SiO$_3$, CaSiO$_3$, ZrSiO$_4$, K$_2$GeO$_3$, Li$_2$GeO$_3$, Na$_2$GeO$_3$, Bi$_2$Sn$_3$O$_9$, MgSnO$_3$, SrSnO$_3$, PbSiO$_3$, PbMoO$_4$, PbTiO$_3$, SnO$_2$—Sb$_2$O$_3$, CuSeO$_4$, Na$_2$SeO$_3$, ZnSeO$_3$, K$_2$TeO$_3$, K$_2$TeO$_4$, Na$_2$TeO$_3$ and Na$_2$TeO$_4$, sulfides such as FeS, Al$_2$S$_3$, MgS and ZnS, fluoride such as LiF, MgF$_2$ and SmF$_3$, chlorides such as HgCl, FeCl$_2$ and CrCl$_3$, bromides such as AgBr, CuBr and MnBr$_2$, iodides such as PbI$_2$, CuI and FeI$_2$, and metallic oxides such as SiAlON.

Among these inorganic compounds, oxides containing a Ce atom are preferred since more dense surface protection film can be obtained.

CeOx is more preferred since driving voltage does not increase excessively. CeO$_2$ is most preferred since its handling is easier from the point of view of its properties.

However, in the case where oxides of Ce are used as a material constituting a surface protection film, the oxides include, but are not limited to, CeO$_2$, CeOx wherein $1.5 < x \leq 2$. It has been found that CeOx wherein x is not 2 has properties similar to those of CeO$_2$.

(b) Film Thickness

The thickness of surface protection film is preferably from 1 Å to 100 Å.

If the thickness of surface protection film is less than 1 Å, the film may not be formed uniformly. If the thickness of surface protection film exceeds 100 Å, its conductivity may be reduced, resulting in higher voltage.

For these reasons, the thickness is preferably from 5 Å to 75 Å, more preferably from 10 Å to 45 Å.

(8) Examples of Construction

Typical constructions of organic EL element are shown below.

(i) Transparent electrode (anode)/Surface protection film/Emitting layer/cathode (ii) Transparent electrode (anode)/Surface protection film/Hole injection layer/Emitting layer/cathode (iii) Transparent electrode (anode)/Surface protection film/Emitting layer/Electron injecting layer/cathode (iv) Transparent electrode (anode)/Surface protection film/Hole injection layer/Emitting layer/Electron injecting layer/cathode (v) Anode/Surface protection film/Organic semiconductor layer/Emitting layer/Surface protection film/Transparent electrode (cathode)

(vi) Anode/Surface protection film/Organic semiconductor layer/Electron barrier layer/Emitting layer/Surface protection film/Transparent electrode (cathode)

(vii) Anode/Surface protection film/Hole injection layer/Emitting layer/Adhesion improving layer/Surface protection film/Transparent electrode (cathode)

Among these constructions, (iv) is preferably used in general.

SECOND EMBODIMENT

A second embodiment is directed to a method for producing organic EL element comprising the following steps 1 to 4.

the step 1 of forming an anode on a substrate;

the step 2 of subjecting the surface of the anode to inverse sputtering;

the step 3 of forming an organic layer including an emitting layer; and the step 4 of forming an cathode.

(1) Step 1

Preferred methods for forming an anode include, but are not limited to, dry film forming methods such as deposition, sputtering, ion plating, electron beam deposition, chemical vapor deposition (CVD), metal-organic chemical vapor deposition (MOCVD) and plasma chemical vapor deposition (plasma CVD) to avoid influences of water absorption.

(2) Step 2

The step 2 is the step where the surface of an anode is subjected to inverse sputtering. In this step, an inverse sputtering processing using a sputtering method is preferred since it can effectively remove surface defects.

That is, power applied to a cathode (target) is lowered so that only plasma reaches to the surface of anode but sputtering particles (material of surface protection film) do not reach to the surface thereof under controlled conditions.

The inverse sputtering conditions in the step 2 will be explained below.

(a) RF Sputtering Device

Ordinary RF sputtering devices are preferably used for inverse sputtering since they allow effective removal of surface defects in the surface of anode. Among RF sputtering devices, more preferred is a helical sputtering method using an inductively coupled RF plasma sputtering magnetron sputtering device (ICMS) 10 as shown in FIG. 1.

Figure 1:
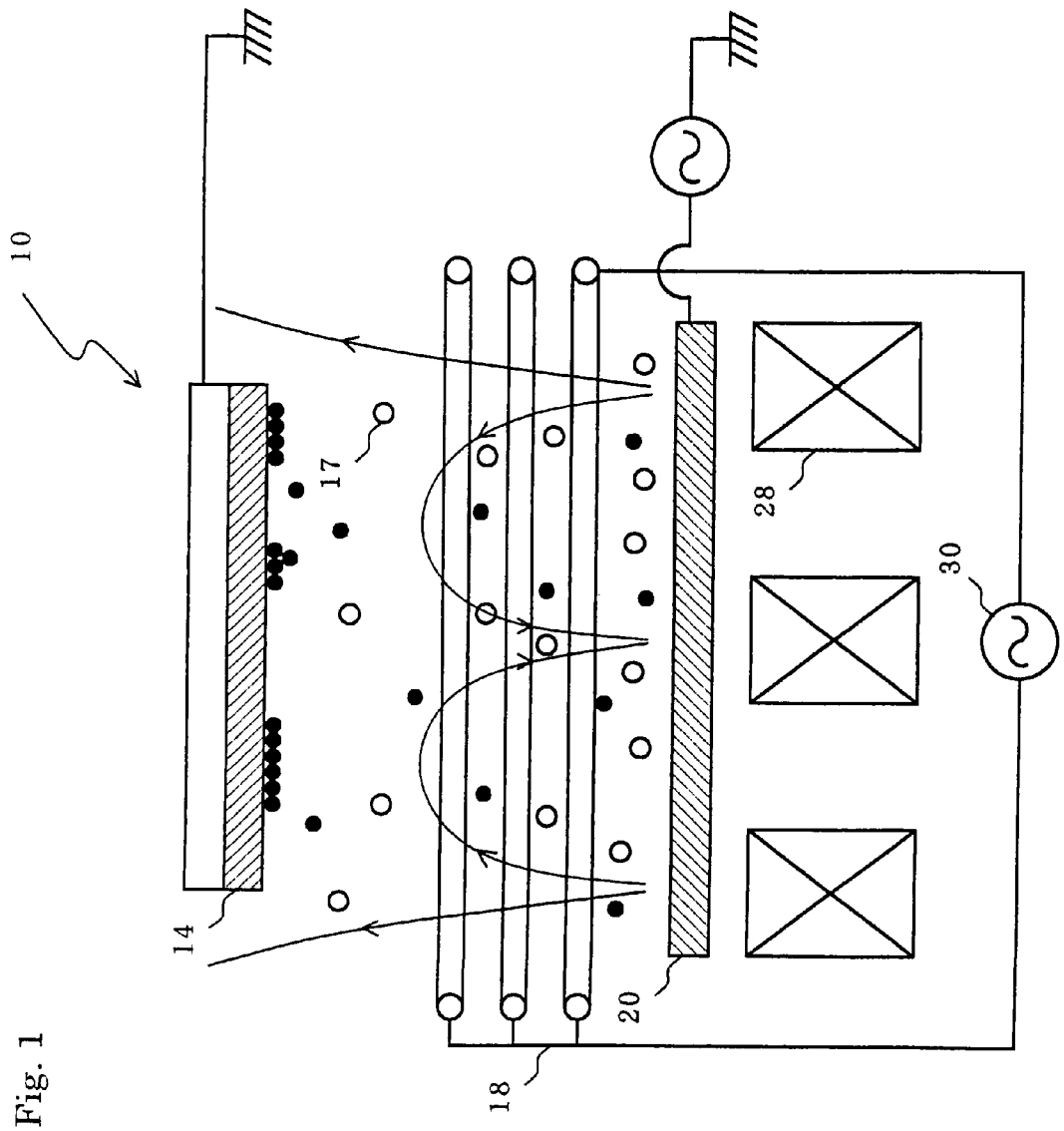
FIG. 1 is a diagrammatic view of an inductively coupled RF plasma supporting magnetron sputtering device.

As shown in FIG. 1, in the ICMS 10, there are provided around a target 20 a power 30 for supplying high-frequency waves to a RF band, and a helical coil 18 for inductive coupling. A magnetron field generating device 28 is placed behind the target 20.

Further, as shown in FIG. 1, in the ICMS 10, a substrate 14 is placed oppositely to the target 20 so that the surface of the substrate 14 can be subjected to inverse sputtering by a sputtering gas 17.

(b) Distance Between Target and Substrate

The ICMS is featured by that the relatively longer distance between target and substrate compared with ordinary RF sputtering devices.

Therefore surface defects can be effectively reduced by adjusting the distance between a target and s substrate in a wider range. Sputtering damage to the substrate (ITO substrate) can also be suppressed.

Specifically the distance between target and substrate is preferably from 15 cm to 50 cm.

If the distance is less than 15 cm, it may be difficult to control an inverse sputtering processing and suppress sputtering damage. If it exceeds 50 cm, it may be difficult to effectively reduce surface defects.

For these reasons, the distance is preferably from 20 cm to 40 cm, more preferably from 25 cm to 35 cm.

(c) Power and Frequency

When carrying out the helical sputtering method using an ICMS, preferably, power of 50 to 200 W and high-frequency waves of 13.56 to 100 MHz are applied to a helical coil, while power of 200 to 500 W and high-frequency waves of 13.56 to 100 MHz are applied to a cathode for plasma discharge.

These conditions are selected to avoid sputtering damage to a substrate in case of forming an anode protection film from a metal oxide and the like or carrying out inverse sputtering.

More preferably, power of 50 to 200 W and high-frequency waves of 13.56 to 100 MHz are applied to a helical coil, while power of 200 to 500 W and high-frequency waves of 13.56 to 100 MHz are applied to a cathode for plasma discharge.

(d) Magnetic Field

A magnetic filed preferably has a strength of 200 to 300 gauss.

If the strength is less than 200 gauss, a magnetic field required to continue plasma discharge may not be maintained. If it is larger than 300 gauss, the state of sealing plasma may change and therefore uniform discharge may not be maintained dependently on the kind of device.

For these reasons, the strength of magnetic field is preferably from 200 gauss to 300 gauss, more preferably from 230 gauss to 270 gauss.

(e) Sputtering Time

When carrying out the helical sputtering method using an ICMS, sputtering time is preferably from 0.1 minute to 60 minutes.

If the sputtering time is less than 0.1 minute, it may be difficult to control an inverse sputtering processing and suppress sputtering damage. If it exceeds 60 minutes, the processing time may be excessively long.

For these reasons, the sputtering time is preferably from 1 minute to 30 minute, more preferably from 2 minute to 15 minute.

(f) Sputtering Gas

An inert gas used generally such as Ar, Xe and Kr may be preferably used as a sputtering gas.

The sputtering gas pressure is preferably from 0.01 Pa to 3 Pa.

If the sputtering gas pressure is less than 0.01 Pa, it may be difficult to effectively reduce surface defects. If it is higher than 3 Pa, target particles sputtered may be damaged by molecules of a sputtering gas, thereby significantly lowering the speed of forming a film by sputtering.

For these reasons, the sputtering gas pressure is preferably from 0.05 Pa to 1 Pa, more preferably from 0.1 Pa to 0.25 Pa.

The flow amount of sputtering gas is preferably from 50 sccm (standard cubic centimeter per minute) to 500 sccm.

If the flow amount of sputtering gas is less than 50 sccm, it may be difficult to effectively remove surface defects. If it is higher than 500 sccm, it may be difficult to control a half band width.

For these reasons, the flow amount of sputtering gas is preferably from 70 sccm to 300 sccm, more preferably from 80 sccm to 250 sccm.

Figure 10:
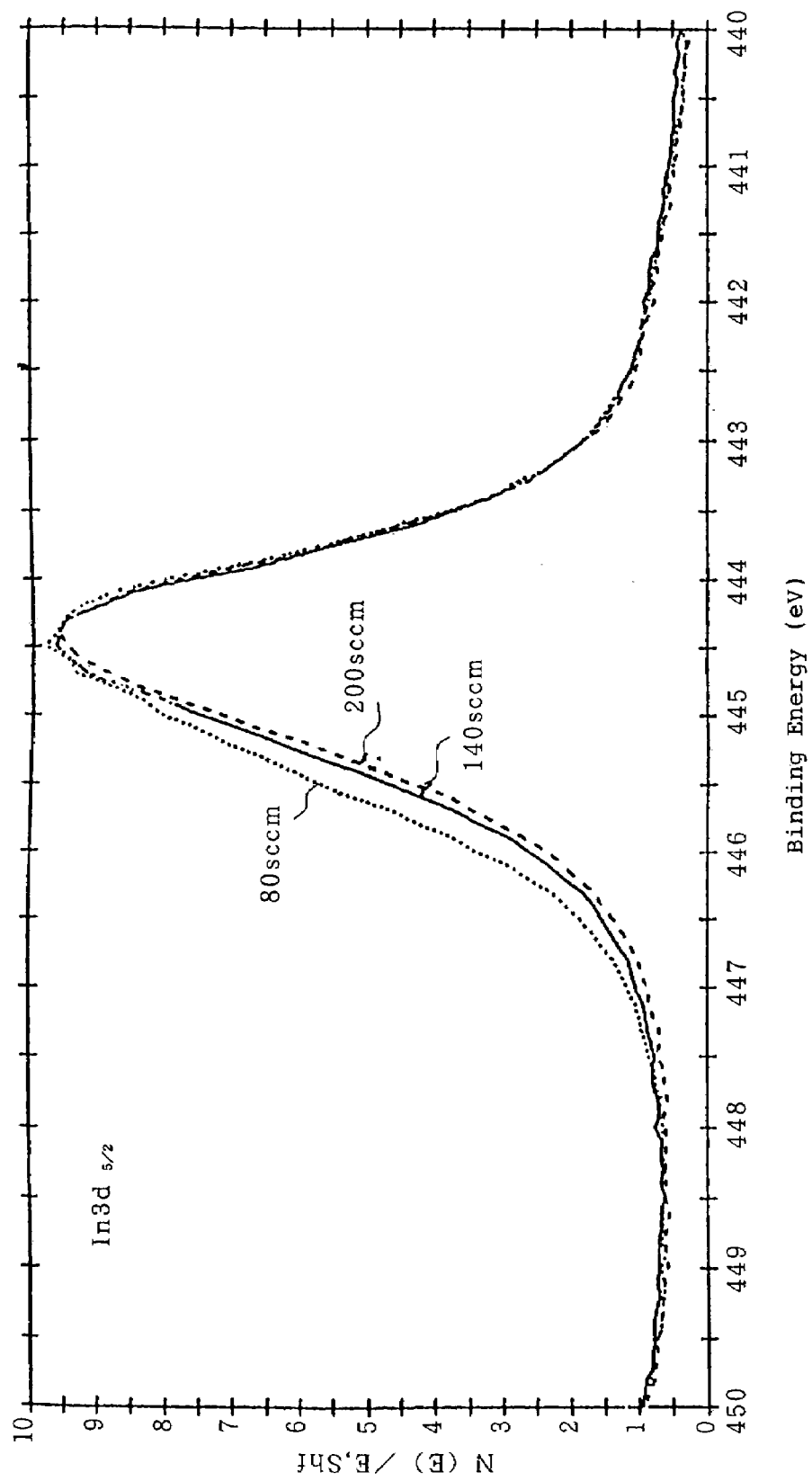
FIG. 10 is a view showing $In3d_{5/2}$ spectral peaks by XPS in an ITO surface subjected to inverse sputtering by changing a flow amount of sputtering gas (oxygen partial pressure).

FIG. 10 shows influences on $In3d_{5/2}$ spectral peaks by XPS when changing the flow amount of sputtering gas to 80 sccm, 140 sccm and 200 sccm in inverse sputtering in Example 1.

Figure 11:
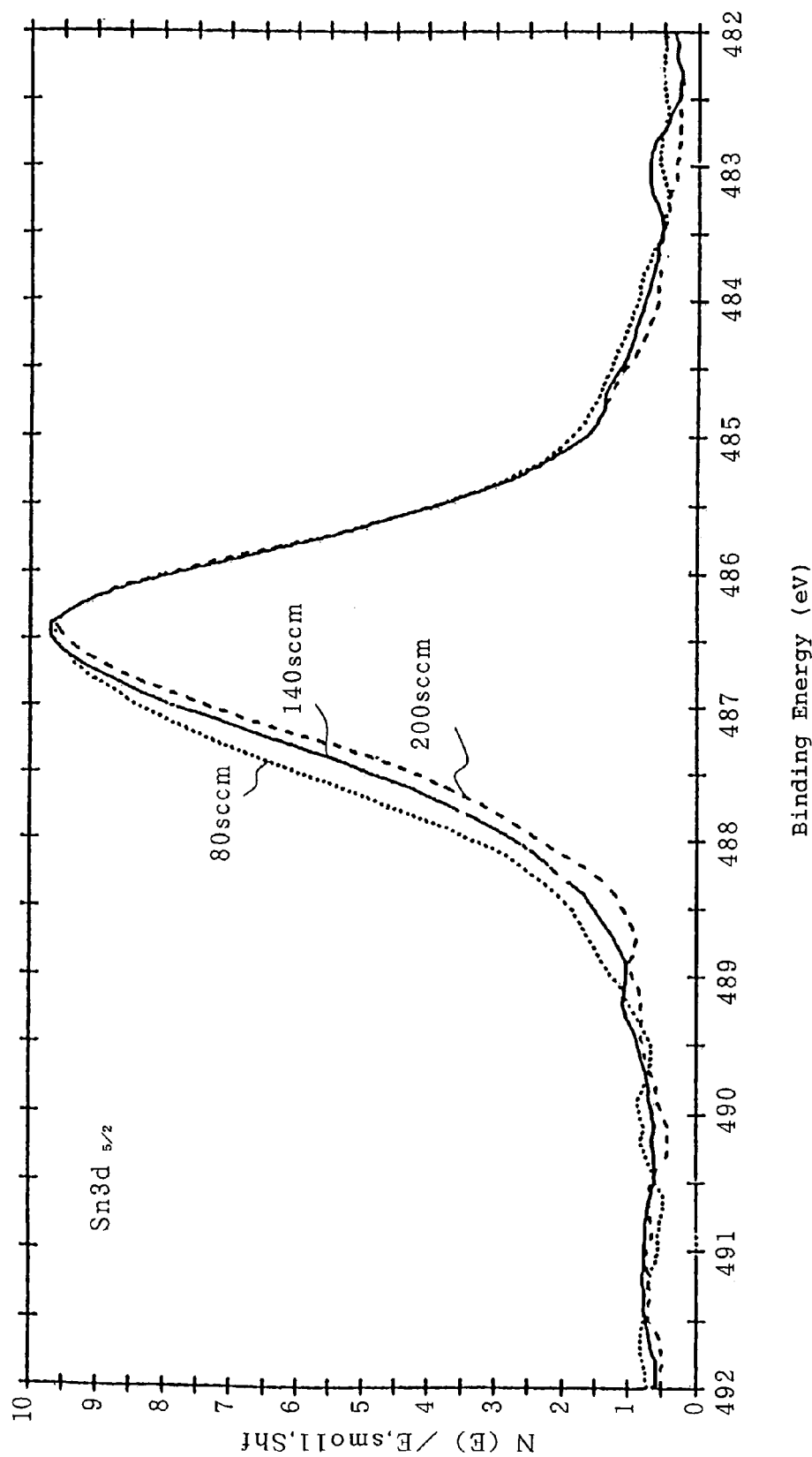
FIG. 11 is a view showing $In3d_{5/2}$ spectral peaks by XPS in an ITO surface subjected to inverse sputtering by changing a flow amount of sputtering gas (oxygen partial pressure).

FIG. 11 shows influences on $Sn3d_{5/2}$ spectral peaks when similarly changing the flow amount of sputtering gas in inverse sputtering.

Figure 12:
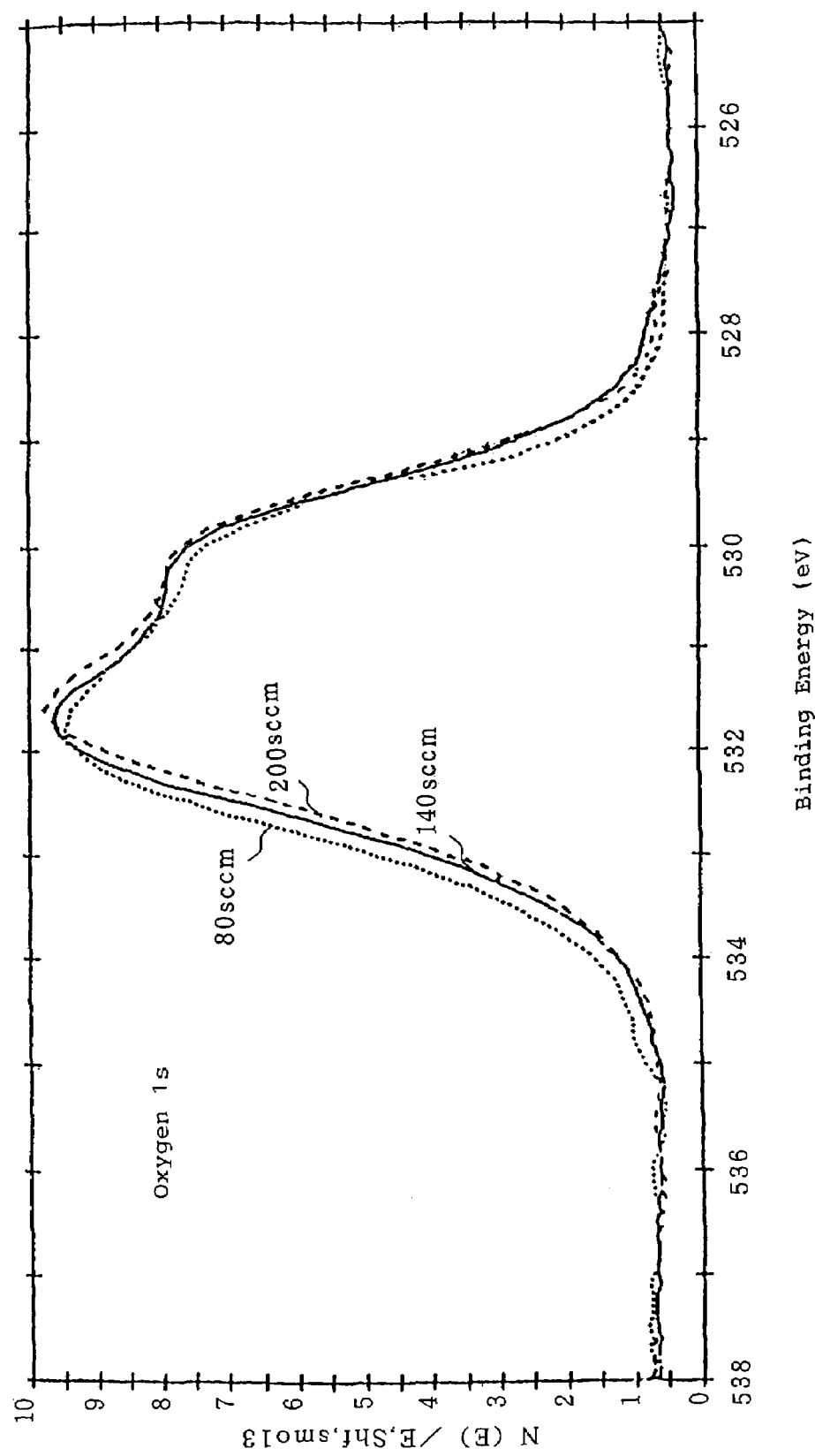
FIG. 12 is a view showing oxygen is spectral peaks by XPS in an ITO surface subjected to inverse sputtering by changing a flow amount of sputtering gas (oxygen partial pressure).

FIG. 12 shows influences on oxygen is spectral peaks when similarly changing the flow amount of sputtering gas in inverse sputtering.

In these tests, there is a tendency that larger the flow amount of sputtering gas is, smaller the half band width of each spectral peak is.

(g) Evacuated Pressure

When carrying out the helical sputtering method using an ICMS, an evacuated pressure is preferably from 0.01 Pa to 3 Pa.

If the evacuated pressure is lower than 0.01 Pa, it may be the same as or lower than the under limit for maintenance of discharge, resulting in stop of discharge. If it is higher than 3 Pa, a discharge gas such as rare gases obstructs the arrival of sputtering particles to a substrate, thereby lowering a sputtering speed (speed of forming a film).

For these reasons, the evacuated pressure is preferably from 0.1 Pa to 3 Pa, more preferably from 0.5 Pa to 1.5 Pa.

(3) Step 3

The step 3 is the step of forming an organic layer containing an emitting layer.

Preferred methods for forming such an organic layer include, but are not limited to, dry film forming methods such as deposition, sputtering, ion plating, electron beam deposition, CVD, MOCVD and plasma CVD to avoid influences of water absorption.

Preferred structures of the organic layer are similar to the first embodiment.

(4) Step 4

The step 4 is the step of forming a cathode. Like the formation of organic layer, preferred methods include dry film forming methods such as deposition, sputtering, ion plating, electron beam deposition, CVD, MOCVD and plasma CVD to avoid influences of water absorption.

Preferred structures of the cathode are similar to the first embodiment.

THIRD EMBODIMENT

A third embodiment is directed to a method for producing an organic EL element characterized by comprising the following steps 1 to 4 and the step 2'.

the step 1 of forming an anode on a substrate;
the step 2 of subjecting the surface of the anode to inverse sputtering;
the step 2' of forming a surface protection film on the surface of the anode;
the step 3 of forming an organic layer including an emitting layer; and
the step 4 of forming an cathode.

The step 2' which characterizes the third embodiment will be described below.

In the step 2', a surface protection film of an inorganic compound or carbon is formed preferably after or at the same time when surface defects of anode are removed.

Such surface protection film can effectively prevent from surface defects to occur on the surface of anode again.

The materials, thickness and the like of surface protection film are similar to the first embodiment.

(1) Formation Method 1

Specifically a sputtering method is used as a method of forming a surface protection film and the following steps preferably are performed:

(a) Before the introduction of gas, an evacuated pressure is reduced to $5\times10^{-3}$ Pa or lower, more preferably $1\times10^{-4}$ Pa or lower.

(b) A discharge gas such as Ar is introduced in a vacuum chamber. At this time, an evacuated pressure is preferably from $1\times10^{0}$ to $1\times10^{-2}$ Pa, more preferably from 0.3 to 1.0 Pa.

(c) Power of 50 to 200 W and high-frequency waves of 13.56 to 100 MHz are applied to a helical coil (coil for inductive coupling), while power of 200 to 500 W and high-frequency waves of 13.56 to 100 MHz are applied to a cathode, resulting in plasma discharge. At this time, the magnetic filed preferably has a strength of 200 to 300 gauss.

(d) An ITO surface and a target surface are cleaned by sufficient inverse sputtering. Preferably the cleaning is performed at least for 5 minutes, particularly at least for 30 minutes firstly after a target change.

(e) Next, a main shutter is opened and a surface protection film is formed until a certain thickness of 5 to 100 Å.

This method can give proper kinetic energy for removing surface defects to the surface of anode. As a result, surface defects can be effectively removed and a surface protection film of inorganic compounds can also be easily formed on the surface from which surface defects have been removed.

(2) Formation Method 2

The step 2' is preferably conducted using an inductively coupled RF plasma supporting magnetron sputtering device as shown in FIG. 1 by the helical sputtering method.

Because a surface protection film made of an inorganic compound can be easily formed on a surface at the same time when surface defects are removed from the surface.

When forming the surface protection film, the inorganic compound constituting the surface protection film is used as a target.

According to the organic El element of the present invention, there is provided the organic El element that has low voltage increase at the constant-current driving time and long life time.

According to the method for producing organic EL element of the present invention, such organic El element can be produced effectively.

EXAMPLES

The present invention will be described in detail by Examples. The present invention isn't limited to these Examples.

Example 1

(1) Preparation of Substrate with Anode Thereon

An ITO anode with a thickness of 120 nm was formed on a glass substrate 24 nm long 1.1 mm wide and 1.1 mm thick.

This substrate was subjected to ultrasonic cleaning while immersed sequentially in isopropyl alcohol, purified water and isopropyl alcohol each for 3 minutes.

Next a dry nitrogen gas was blown to the glass substrate to remove organic solvents and the like in a clean room of class 1,000. Thereafter the ITO surface was further cleaned using an UV/ozone cleaning machine.

A $CeO_2$ film with a thickness of 20 Å was formed on the ITO surface of substrate as a surface protection film using an inductively coupled RF plasma supporting magnetron sputtering device 10 shown in FIG. 1 (hereinafter referred to as a helical sputtering method). Specifically the film was formed by the following steps:

(a) A $CeO_2$ target and a substrate cleaned was placed in a sputtering chamber. The distance from the target to the substrate was 30 cm.
(b) Next evacuation was carried out. After the evacuated pressure reached to $2 \times 10^{-4}$ Pa or less, 80 sccm of Ar gas was introduced as a discharge gas by a mass flow controller. At this time, the evacuated pressure was 0.38 Pa.
(c) Next while closing a main shutter just above the target, power of 50 W and high-frequency waves of 13.56 MHz were applied to a helical coil for inductive coupling, while power of 500 W and high-frequency waves of 13.56 MHz were applied to a $SiO_2$ target (cathode), resulting in plasma discharge. At this time the reflection of each coil was 5 W or less.

The plasma discharge was continued for 5 minutes while closing the main shutter so that the surface of $CeO_2$ target was subjected to the sputtering processing.

(d) Next the main shutter was opened and a $CeO_2$ film was formed on the ITO surface for 6 minutes and 10 seconds. As a result, a $CeO_2$ film with a thickness of 20 Å was formed on the ITO.
(e) Next the ITO substrate with the $CeO_2$ layer was removed from the sputtering chamber and then placed in a vacuum vessel of an XPS device.
(f) For the ITO surface and interior (bulk) at the depth of 50 Å from the surface after the sputtering by $Ar^+$ ions, the half band widths of $In3d_{5/2}$ were analyzed.

The analysis showed that the half band width of $In3d_{5/2}$ was 1.90 eV in the surface of $CeO_2$/ITO, while it was 1.71 eV in the ITO interior at the depth of 50 Å. The half band width of $In3d_{5/2}$ was measured through $CeO_2$ in the surface.

It was found that there was no significant deference between the surface and the interior at the depth of 50 Å in ITO composition.

The work function of the surface of ITO/$CeO_2$ film measured by a device (Riken Keiki Co., Ltd., AC-1) was 5.86 eV.

(2) Preparation of Organic EL Element

A blue organic EL element was formed on the substrate with a 20 Å thick $CeO_2$ layer thereon thus obtained in (1) by sequential processes while maintaining vacuum. Specifically, the substrate with a $CeO_2$ layer formed as a surface protection film on the anode was accommodated in a vacuum deposition device and thereafter evacuation was carried out to $2 \times 10^{-4}$ Pa or less. Next an organic EL element was prepared under the following conditions:

(a) First Hole Injecting Layer
4,4',4"-tris[N-(3-methylphenyl)-N-phenylamino]-triphenylamine (MTDATA)
Deposition Rate: 0.1 to 0.3 nm/s
Film Thickness: 60 nm (b) Second Hole Injecting Layer
4,4'-tris[N-(3-naphtyl)-N-phenylamino]biphenyl (NPD)
Deposition Rate: 0.1 to 0.3 nm/s
Film Thickness: 20 nm (c) Emitting Layer (Host/Dopant)
Film Thickness: 40 nm
Host (Emitting material): 4,4'-bis(2,2-diphenylvinyl)-biphenyl (DPVBi)
Deposition Rate: 0.4 nm/s
Dopant: 4,4'-bis(2-(4-(N,N-di-p-tolyl)phenyl)vinyl)-biphenyl (DTAVBi)
Deposition Rate: 0.01 nm/s
Dopant Concentration: 2.5 wt %

(d) Electron Transporting Layer
Tris(8-quinolynol)aluminum (Alq)
Deposition Rate: 0.1 to 0.3 nm/s
Film Thickness: 20 nm (e) Cathode
Al/Li Alloy (Li concentration, 10 at %)
Deposition Rate: 0.5 to 1.0 nm/s
Film Thickness: 150 nm (3) Evaluation of Organic EL Element When a direct current of 5V was applied to the organic EL element thus prepared, the current value was 5.12 mA/cm$^2$ and its luminous brightness was 423 nit. The power-conversion efficiency was 5.19 lm/W. A dark spot was not visually observed in an emitting area of 4×8 mm and uniform emitting was observed.

The organic EL element was driven by a constant direct current with an initial brightness of 1,000 nit. The half time during which its brightness was reduced by half was 2,550 hours. The voltage increased by 0.53 V for this period. These results are shown in Tables 1 and 2.

Comparative Example 1

(1) Preparation of Substrate with Anode Thereon (ITO Substrate)

An ITO substrate was prepared, which substrate was the same as that prepared in Example 1 except that a $CeO_2$ layer was not formed as a surface protection film.

That is, the half band widths of ITO surface and interior at the depth of 50 Å were measured immediately after wet cleaning by organic solvents and UV/$O_3$ cleaning without forming a $CeO_2$ layer unlike Example 1.

As a result, the half band width of $In3d_{5/2}$ was 2.32 eV in the surface of substrate, while it was 1.71 eV in the ITO interior at the depth of 50 Å. It was found that there was a significant deference between the surface and the interior in ITO composition.

Therefore it is predicted that an ITO substrate that has been subjected to only ordinary cleaning has many surface defects.

The work function of the surface of ITO substrate measured by a device (Riken Keiki Co., Ltd., AC-1) was 5.02 eV.

(2) Preparation of Organic EL Element

An organic EL element was prepared using the ITO substrate obtained in (1) in a similar way to Example 1.

(3) Evaluation of Organic EL Element

When a direct current of 6V was applied to the organic EL element prepared in (2), the current value was 4.20 mA/cm$^2$ and its luminous brightness was 380 nit. The power-conversion efficiency was 4.74 lm/W. A dark spot was not visually observed in an emitting area of 4×8 mm.

The organic EL element was driven by a constant direct current under the condition of a 1,000 nit initial brightness. The half time was 1,350 hours. The voltage increased by 3.35 V for this period.

It was confirmed that the half time at the time of constant-direct-current driving was short and increase in voltage was large. It seems to be caused by the surface defects existing on the ITO surface.

Comparative Example 2

(1) Preparation of Substrate with Anode Thereon (ITO Substrate)

A SiO$_2$ film was formed by electron beam deposition in place of the CeO$_2$ film in Example 1.

Specifically the film was formed by the following steps:

(a) An ITO substrate was placed in a vacuum chamber. An electron beam deposition source EGK-3M made by Nihon Shinku Gijutsu Kaisha (ULVAC, Inc) was mounted and a SiO$_2$ pellet was then placed.
(b) Vacuum evacuation was carried out to 2×10$^{-4}$ Pa. For the SiO$_2$ pellet, a current was gradually increasingly applied to a filament to effect degassing. A shutter closer to the substrate (main shutter) was closed and the evacuated pressure was maintained to be about 1×10$^{-4}$ Pa for this period.
(c) Next voltage for accelerating an electron beam was adjusted to 5 kV and the deposition rate of SiO$_2$ film was controlled. Specifically a current was increased until the deposition rate determined by a film-thickness-measuring device of quartz oscillation type became 0.1 Å/s, and maintained for 3 minutes, thereby stabilizing the deposition rate.
(d) Next the main shutter was opened and a SiO$_2$ film was deposited by an electron beam on the ITO substrate to a 20 Å thickness.

For the substrate thus prepared, half band widths of In3d$_{5/2}$ spectral peaks were measured in the ITP surface and interior at the depth of 50 Å like Example 1.

As a result, the half band width of In3d$_{5/2}$ spectral peak was 2.13 eV in the surface of substrate, while it was 1.72 eV in the ITO interior at the depth of 50 Å.

Therefore it was found that there were surface defects on the ITO surface of substrate on which the SiO$_2$ film of 20 Å thickness was formed by electron beam deposition.

The work function of the ITO/SiO$_2$ surface measured by a device (Riken Keiki Co., Ltd., AC-1) was 4.98 eV.

(2) Preparation of Organic EL Element

An organic EL element was prepared using the ITO substrate obtained in (1) in a similar way to Example 1.

(3) Evaluation of Organic EL Element

The organic EL element obtained in (2) was driven by a constant direct current under the condition of a 1,000 nit initial brightness to measure its half time and voltage increase like Example 1.

As a result, when a direct current of 6V was applied to the organic EL element with the 20 Å thick SiO$_2$ film formed by electron beam deposition, a current of 4.18 mA/cm$^2$ passed and blue emission of a 380 nit brightness was observed. Thus the initial properties were substantially the same as those of Example 1 and Comparative Example 1.

A dark spot was not visually observed in an emitting area and the emission was uniform. These results are shown in Table 1.

Apparently from the results, the half time of organic EL element was 1,800 hours and the voltage increased by 1.52 V for this period.

It was confirmed that the half time at the time of constant-direct-current driving was short and increase in voltage was large. It seems to be caused by that electron beam deposition could not effectively remove surface defects.

Example 2

(1) Preparation of ITO Substrate and Organic EL Element

An organic EL element was formed under the same conditions as Example 1 except that the 60 nm thick first hole injecting layer was formed by using NPD in place of MTDATA.

(2) Evaluation of Organic EL Element

When a direct current of 5 V was applied to the organic EL element prepared, a current of 5.08 mA/cm$^2$ passed, the power-conversion efficiency was 5.63 lm/W and blue emission of a 456 nit brightness was observed. A dark spot was not visually observed in an emitting area.

Next the organic EL element was driven by a constant direct current under the initial condition of 1,000 nit to measure its half time and voltage increase.

As a result, the half time was 2,500 hours and the voltage increased by 0.68 V for this period.

Apparently from the results, it was confirmed that the half time at the time of constant-direct-current driving was as long as 2500 hours and the increase in voltage was as small as 0.7 V. It seems to be caused by effective removal of surface defects.

Comparative Example 3

(1) Preparation of ITO Substrate and Organic EL Element

A commercially available ITO substrate was prepared. After the substrate had been subjected to only cleaning shown in Comparative Example 2, an organic EL element was formed like Example 2.

(2) Evaluation of Organic EL Element

When a direct current of 6 V was applied to the organic EL element prepared, a current of 3.20 mA/cm$^2$ passed, the power-conversion efficiency was 4.35 lm/W and blue emission of a 266 nit brightness was observed. A dark spot was not visually observed in an emitting area.

Next the organic EL element was driven by a constant direct current under the initial condition of 1,000 nit to measure its half time and voltage increase.

As a result, the half time was 800 hours and the voltage increased by 3.50 V for this period.

Apparently from the results, it was confirmed that the half time at the time of constant-direct-current driving was as short as 1,000 hours or less and the increase in voltage exceeds 3 V. It seems to be caused by no removal of surface defects.

Example 3

(1) Preparation of Substrate with Anode (ITO substrate) and Organic EL Element A 200 nm thick IZO layer was formed on a substrate of the same size as that of Example 1. This substrate was cleaned, the IZO (electrode) surface of electrode substrate was subjected to inverse sputtering by an inductively coupled RF plasma sputtering magnetron sputtering device 10 shown in FIG. 13, and a 20 Å thick $CeO_2$ film was formed as a surface protection film in the same way as the embodiment of production method. Specifically the film was formed by the steps of Example 1. The work function of the surface of $IZO/CeO_2$ film measured by a device (Riken Keiki Co., Ltd., AC-1) was 6.12 eV.

An organic EL element was then formed using the IZO substrate like Example 1.

(2) Evaluation of Organic EL Element

The organic EL element prepared in (1) was tested for emission (application of DC 5 V), and its half time and voltage increase were measured when continuously driven by a constant direct current under the initial condition of 1,000 nit. These results are shown in Table 2.

Apparently from the results, it was confirmed that the half time was as long as 2,000 hours or more and the increase in voltage was as small as 0.4 V or less like Example 1.

Comparative Example 4

(1) Preparation of Substrate with Anode Thereon (IZO Substrate)

An IZO substrate similar to that of Example 3 was prepared except that a $CeO_2$ was not formed as a surface protection film. The work function of the surface of IZO film measured by a device (Riken Keiki Co., Ltd., AC-1) was 5.11 eV.

An organic EL element was formed using the IZO substrate and evaluated like Example 1. These results are shown in Tables 1 and 2.

(2) Evaluation of Organic EL Element

The organic EL element prepared in (1) was tested for emission (application of DC 6 V), and its half time and voltage increase were measured when continuously driven by a constant direct current under the initial condition of 1,000 nit. These results are shown in Table 2.

As a result, the half time was 1,010 hours and the voltage increased by 3.51 V for this period.

Apparently from the results, it was confirmed that the half time was as short as 1,000 hours or less and the increase in voltage exceeded 3 V. It seems to be caused by no removal of surface defects.

Comparative Example 5

A 20 Å thick $SiO_2$ film was formed by electron beam deposition on IZO to form an IZO substrate in the same way as Comparative Example 2. The work function of the surface of $IZO/SiO_2$ film measured by a device (Riken Keiki Co., Ltd., AC-1) was 4.94 eV.

An organic EL element was formed using the IZO substrate and evaluated like Example 1. These results are shown in Tables 1 and 2.

TABLE 1

| | Surface Processing | Surface Protection Layer | $(3d_{5/2})_h$ | $(3d_{5/2})_n$ | Ratio of Half Band Width | Ratio of Area $S_B/S_A$ |
|---|---|---|---|---|---|---|
| Example 1 | None | $CeO_2$ 20A | 1.90 | 1.71 | 1.11 | — |
| Example 2 | ICMS | $CeO_2$ 20A | 2.01 | 1.71 | 1.18 | — |
| Example 3 | ICMS | $CeO_2$ 20A | 1.90 | 1.75 | 1.09 | 0.18 |
| Comparative Example 1 | None | — | 2.32 | 1.71 | 1.36 | 1.25 |
| Comparative Example 2 | Electron Beam | $SiO_2$ 20A | 2.13 | 1.72 | 1.25 | — |
| Comparative Example 3 | None | — | 2.25 | 1.71 | 1.32 | — |
| Comparative Example 4 | None | — | 2.45 | 1.75 | 1.40 | 1.30 |
| Comparative Example 5 | Electron Beam | $SiO_2$ 20A | 2.20 | 1.75 | 1.26 | — |

TABLE 2

| | Current Density (mA/cm²) | Luminous Brightness (nit) | Luminous Efficiency (lm/w) | DS | Half Time (Hrs) | Voltage Increase (V) |
|---|---|---|---|---|---|---|
| Example 1 | 5.12 | 423 | 5.19 | None | 2550 | 0.53 |
| Example 2 | 5.08 | 456 | 5.63 | None | 2500 | 0.68 |
| Example 3 | 5.31 | 470 | 5.56 | None | 2100 | 0.38 |
| Comparative Example 1 | 4.20 | 380 | 4.74 | None | 1350 | 3.35 |
| Comparative Example 2 | 4.18 | 380 | 4.75 | None | 1800 | 1.52 |
| Comparative Example 3 | 3.20 | 266 | 4.35 | None | 800 | 3.50 |
| Comparative Example 4 | 4.23 | 368 | 4.55 | None | 1010 | 3.51 |
| Comparative Example 5 | 4.24 | 372 | 4.59 | None | 1510 | 1.56 |

We claim:

1. A method for producing an organic EL element comprising an anode, a cathode, an organic layer therebetween containing at least an emitting layer, and a surface protection film comprising an inorganic compound between the anode and the emitting layer, comprising the steps of:

forming an anode on a substrate, giving an inorganic compound to the surface of the anode to form a surface protection film, forming an organic layer containing at least an emitting layer, and forming an cathode, wherein a ratio, $[In3d_{5/2}]_h/[In3d_{5/2}]_n$, is from 0.9 to 1.2 wherein $[In3d_{5/2}]_h$ is the half band width of a spectral peak derived from a $3d_{5/2}$ orbit of an In atom in the surface of the anode, and $[In3d_{5/2}]_n$ is the half band width of a spectral peak derived from a $3d_{5/2}$ orbit of an In atom in the interior of the anode, the spectral peaks being measured by X-ray photoelectron spectroscopy (XPS).

2. The method for producing an organic EL element according to claim 1, wherein the surface protection film is formed after or at the same time when the surface of the anode is subjected to inverse sputtering in the step of giving the inorganic compound to the surface of the anode.

3. The method for producing an organic EL element according to claim 2, wherein the inverse sputtering is carried out by inductively coupled RF plasma sputtering magnetron sputtering.

4. The method for producing an organic EL element according to claim 3, wherein the inverse sputtering is carried out by applying power of 50 to 200 W and high-frequency waves of 13.56 to 100 MHz to a helical coil, applying power of 200 to 500 W and high-frequency waves of 13.56 to 100 MHz to a cathode for plasma discharge and making the strength of a magnetic field ranging from 200 to 300 gauss.

* * * * *